United States Patent
Wilson et al.

(10) Patent No.: US 7,038,449 B1
(45) Date of Patent: May 2, 2006

(54) BIASED MAGNETIC FIELD STRENGTH INDICATION TOOL

(75) Inventors: Stephen F. Wilson, Raynham, MA (US); Alan J. Dextradeur, Franklin, MA (US)

(73) Assignee: Codman & Shurtleff, Inc., Raynham, MA (US)

( * ) Notice: Subject to any disclaimer, the term of this patent is extended or adjusted under 35 U.S.C. 154(b) by 0 days.

(21) Appl. No.: 11/097,498

(22) Filed: Apr. 1, 2005

Related U.S. Application Data

(60) Provisional application No. 60/640,956, filed on Dec. 30, 2004.

(51) Int. Cl.
*G01R 33/02* (2006.01)

(52) U.S. Cl. .................. 324/259; 324/244
(58) Field of Classification Search ........... 324/151 R, 324/244, 259–261; 335/306
See application file for complete search history.

(56) References Cited

U.S. PATENT DOCUMENTS 3,142,122 A * 7/1964 Boepple .............. 33/352

* cited by examiner

*Primary Examiner*—Ramon M. Barrera

(57) ABSTRACT

A detection device, for detecting a strength of a magnetic field of an object, includes a housing having a center, a first end and a detection end. A permanent magnetic element is suspended above the center of the housing having a first magnetic field strength and an indicator. A biasing permanent magnetic element is disposed at the first end of the housing and has a second magnetic field strength for biasing the indicator toward the first end. A first distance is between the permanent magnetic element and the biasing permanent magnetic element so that a threshold magnetic field strength can be determined from the first magnetic field strength, the second magnetic field strength and the first distance. Thus, when the object is placed approximate to the detection end and the object magnetic field strength is greater than the threshold magnetic field strength, the indicator rotates toward the detection end.

10 Claims, 2 Drawing Sheets

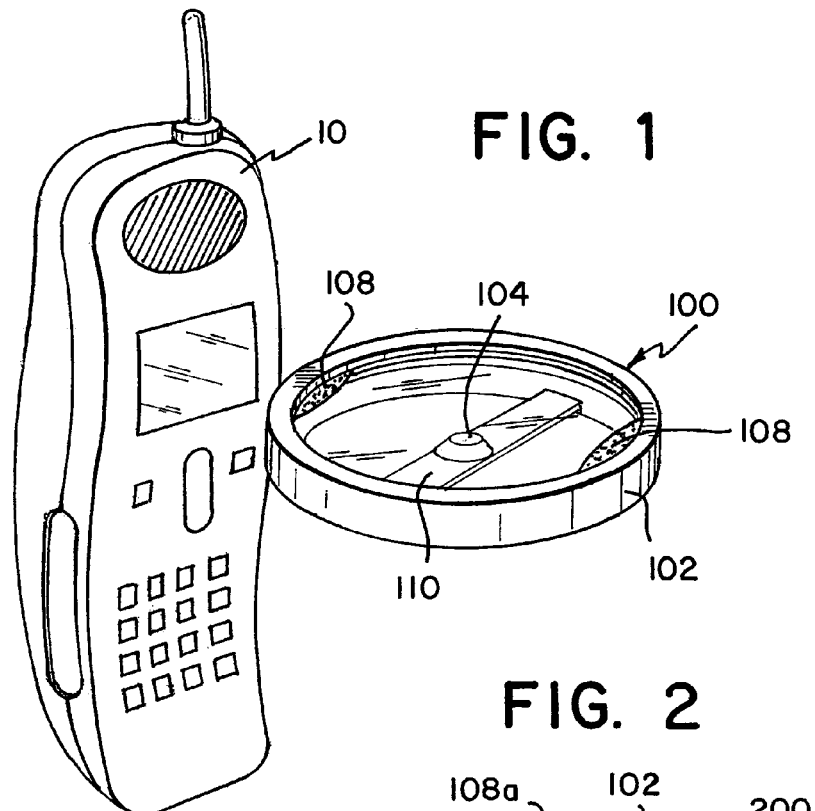
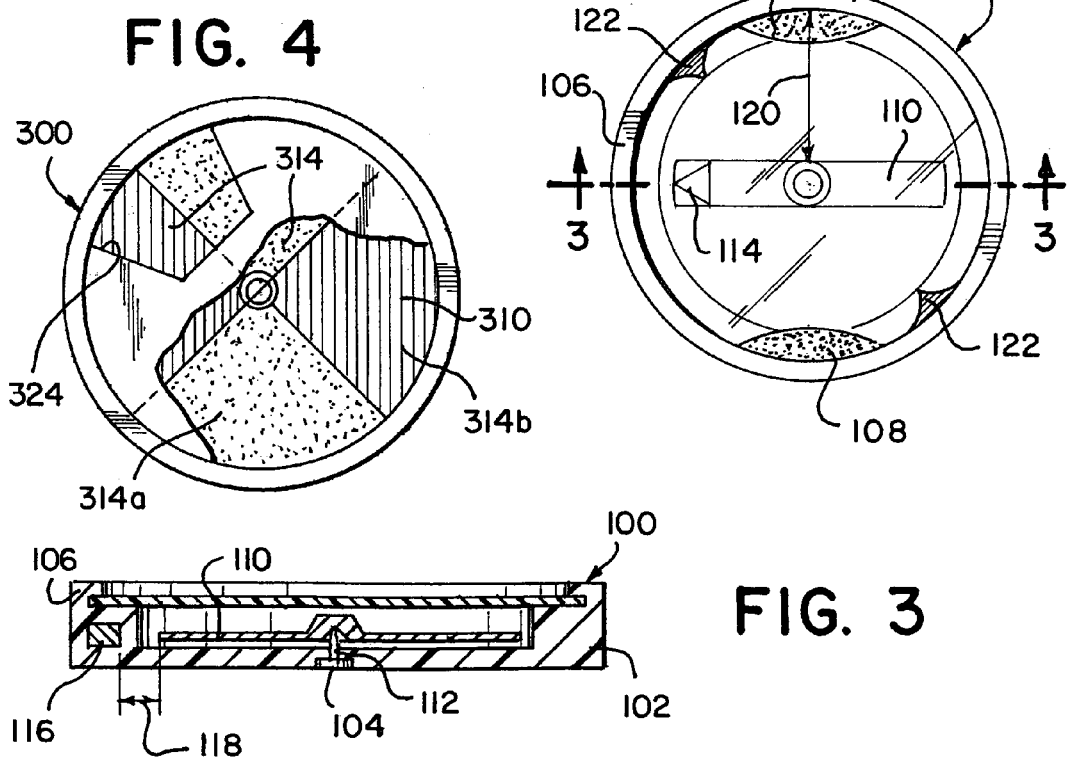

BIASED MAGNETIC FIELD STRENGTH INDICATION TOOL

BACKGROUND OF THE INVENTION

1. Field of the Invention

A detection device used to detect the magnetic field strength of an object that can affect an implanted medical device.

2. Discussion of Related Art

Modern medical device technology provides a number of devices that can be implanted in a patient. The implanted devices monitor a patient's condition, regulate bodily functions, and/or administrate medication to the patient. Examples of implanted devices include pacemakers and medication pumps. Many times there is a need to alter the settings on the device, for example a pump, after it has been implanted. One method to accomplish this, without removing the device, is to use magnetically activated switches. These switches respond to magnetic fields to, for example, open or close valves on a pump. In order to affect such a change, medical personnel place a magnet of specific strength over the implanted device. The magnetic field strength needed to change the setting is orders of magnitude greater than the Earth's magnetic field of 0.3 to 0.6 gauss.

Magnetic switch technology is a simple and effective way to alter the settings on the implanted devices, but it has some drawbacks. Numerous commercial products contain magnets of sufficient strength to alter the settings or otherwise adversely impact the operation of an implanted device. Thus, a patient can unknowingly intersect the magnetic field of one of these objects and alter the operation of the implanted device. Common items like cell phones, speakers and children's toys all may contain magnets of sufficient strength at a close enough distance to alter the operation of the implanted device. Currently, there is no device available that allows a patient to easily and quickly determine if such an item has a magnetic field strong enough to alter the operation of an implanted device.

Numerous prior art devices provide the ability to detect weak magnetic fields. U.S. Pat. No. 2,123,045 to Hoare detects weak magnetic fields to determine the location of metal pipes burred in the ground or walls. Hoare uses one or more ordinary compasses and/or a bar magnet near the compass needle to compensate for the Earth's magnetic field. A user of Hoare's device is required to cause the device to traverse the location of a suspected weak magnetic mass and watch for deflections of the needle. Slight deflections of the needle indicate that the user is nearing the weak magnetic mass and the point of greatest deflection indicates the probable location of the mass. However, Hoare's device is not designed to alert a user to the strength of the magnetic field; but, instead is designed to indicate its location. Hoare is compensating against the Earth's magnetic field because he is looking for very weak fields, not fields of a particular strength.

U.S. Pat. No. 3,349,323 to Mullen discloses using a reed switch biased by two magnetic fields, one from a permanent magnet and another from an electromagnet. The electromagnet is operated by an electrical current that is used to generate a magnetic field in a coil positioned near or around the reed switch. The electrical field generated by the coil is designed to counter the magnetic field generated by the permanent magnetic and acts to keep the switch open, while the permanent magnetic field biases it closed. As Mullen's device approaches a magnetic source, the switch oscillates open and closed with different frequencies, depending on whether the source overcomes the permanent magnetic field or the electromagnetic field. The device senses the oscillations and the frequency of the oscillations is an indication of strength and location. However, this device is complex and requires an electromagnetic circuit, including a battery, a switch, and a milliampmeter to detect the small oscillations of the switch. Calibration of the device is difficult, matching the magnetic field of the permanent magnet, the magnetic resistance of the switch, the power across the coil to form the electromagnetic field and the distance between the three. Further, since the device is powered, it is unreliable due to power spikes or dips that can alter the calibration of the device.

Thus, there is a need in the art for a device that can detect the strength of a strong magnetic field and that is easily calibrated without the use of circuits and battery power to add to the reliability of the device.

SUMMARY OF THE INVENTION

A detection device is used to detect the magnetic field strengths of an object that can affect an implanted medical device. An implanted medical device can be affected by a magnetic field strength of approximately 5 gauss or larger. Modern electronic objects, particularly those containing permanent magnets, for example, cell phones and speakers, can emit a magnetic field that can affect the implanted device when located at close proximity.

The detection device includes a housing having a center, a first end and a detection end. A permanent magnetic element having a first field strength is suspended above the center of the housing. The housing can contain air, an inert gas or a fluid to allow the permanent magnetic element to rotate freely about the center. The permanent magnetic element further includes an indicator, which may be in the form of a colored marking, a point, or other attributes on the top of the element, which allows a patient to determine which way the permanent magnetic element is pointing. The detection device also has a biasing permanent magnetic element that has a second magnetic field strength and is disposed at the first end of housing. The magnetic field strengths generated between the two magnets is greater than the Earth's magnetic field thus biasing the indicator toward the first end. Both the permanent magnetic element and the biasing permanent magnetic element are made of permanent magnetic materials and do not use electricity to generate their magnetic fields. The detection device also has a first distance between the permanent magnetic element and the biasing permanent magnetic element. A threshold magnetic field strength is determined from the first magnetic field strength, the second magnetic field strength and the first distance. Thus, the strength of the two permanent magnets and the distance between them dictate how large a magnetic field is required to move the indicator toward a new magnetic field. The threshold magnetic field strength of the detection device can be preferably set to detect the magnetic field strengths of objects when those strengths are lower than the magnetic field strength that affects the implanted device.

If the magnetic field strength of an object is less than that of the threshold magnetic field strength, the permanent magnetic element is not significantly drawn to the object magnetic field and the indicator remains predominately biased toward the first end. This indicates that the magnetic field strength of the object is of lesser strength than the magnetic field strength required to alter the setting on his implanted medical device (threshold magnetic field strength).

If the object magnetic field strength is greater than the threshold magnetic field strength, the permanent magnetic element is sufficiently affected by the magnetic field of the object such that the indicator pivots toward the detection end. The extent of rotation, the extent to which the object magnetic field strength affects the permanent magnet element, is not a binary result (i.e. "yes" or "no"). The position of the permanent magnet element, with respect to an equilibrium position, when not influenced by any object, can be correlative with the magnitude of the object magnetic field strength. The physical design and artwork of the device can convert this analog response into a binary result.

For example, the permanent magnetic element can be fixed to a disk with quadrants, which can account for polarity, of opposing colors, for example, either black or white, and a fixed blind with a small window superimposed over the moveable permanent magnetic element portion of the housing. The patient can view the window to determine if the object magnetic field strength does or does not exceed the threshold. When the window turns from white to black, this represents the point at which the threshold magnetic field strength has been achieved and the patient is warned to avoid the particular object.

Alternatively, the perimeter of the housing is provided with an incremental scale, such that the rotation of the permanent magnetic element in response to an object magnetic field is calibrated to correspond with the scale. This particular embodiment would not be limited to a selected threshold and it would provide a readable measurement as opposed to a binary result. In this embodiment, the position of the permanent magnet element will be correlative with the magnitude of the object magnetic field strength.

BRIEF DESCRIPTION OF THE DRAWING FIGURES

The above and still further objects, features and advantages of the present invention will become apparent upon consideration of the following detailed description of a specific embodiment thereof, especially when taken in conjunction with the accompanying drawings wherein like reference numerals in the various figures are utilized to designate like components, and wherein:

FIG. 1 is a top perspective view of the biased magnetic field strength indication tool of the present invention with the object;

FIG. 2 is a top view of the biased magnetic field strength indication tool and an embodiment of the present invention;

FIG. 3 is a cross section of the biased magnetic field strength indication tool of the present invention, taken along line 3—3 of FIG. 2;

FIG. 4 is a partial top cut-away section of an embodiment of the biased magnetic field strength indication tool of the present invention.

DETAILED DESCRIPTION OF THE PREFERRED EMBODIMENT

Figure 5:
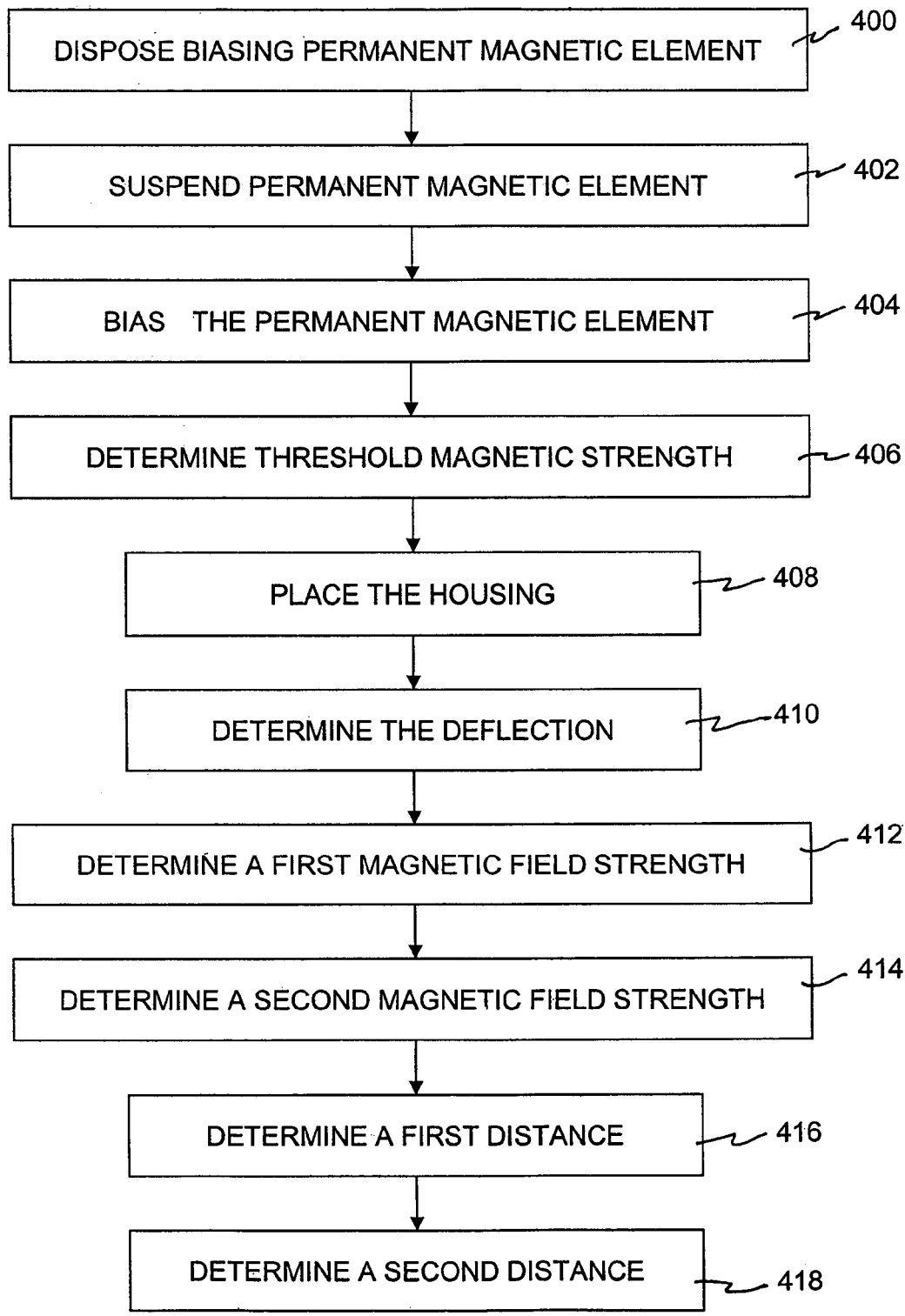
FIG. 5 is a flow chart of a method of the present invention.

Referring to FIGS. 1–4, a detection device 100 for detecting the strength of a magnetic field of an object 10 is illustrated. Detection device 100 is used to detect the magnetic field strengths of object 10 that can affect an implanted medical device (not illustrated). A typical implanted medical device can be affected by a magnetic field strength of approximately 5 gauss or larger. However, modern consumer products, for example, cell phones, speakers, and children's toys possess a magnetic field that can affect the implanted device when located at close proximity. Magnetic field strength weakens as a function of increased distance from the source. Thus, a cell phone that does not alter the settings of the implanted device while at a distance from the implanted device, may elicit an affect if located in apposition to the implant.

Detection device 100 includes a housing 102 having a center 104, a first end 106 and a detection end 108. A permanent magnetic element 110 having a first field strength is suspended above center 104 of housing 102. Housing 102 can contain air, an inert gas or a fluid to allow permanent magnetic element 110 to rotate freely about center 104. Permanent magnetic element 110 is typically balanced on a needle 112 about center 104 to allow essentially frictionless rotation. Permanent magnetic element 110 further includes an indicator 114, which may be in the form of a colored marking, a point, or other attributes on the top of the element, which allows a patient to determine which way permanent magnetic element 110 is pointing. Detection device 100 also has a biasing permanent magnetic element 116 that has a second magnetic field strength and is disposed at the first end 106 of housing 102. The magnetic field strengths generated between the two magnets 110, 116, is greater than the Earth's magnetic field thus, biasing indicator 114 toward first end 106. When biasing permanent magnetic element 116 is not present, permanent magnetic element 110 can be biased by the Earth's magnetic field. In other terms, permanent magnetic element 110 and biasing permanent magnetic element 116 are magnetically coupled as well as object 10 magnetically couples with permanent magnetic element 110. The coupling effect causes the permanent magnetic element 110 to be effected by either the biasing permanent magnetic element 116 or object 10.

Both permanent magnetic element 110 and biasing permanent magnetic element 116 are made of permanent magnetic materials. Thus, magnets 110, 116 do not use electricity to generate their magnetic fields. The magnetic materials are, for example, ferromagnetic (steel), AlNiCo (aluminum, nickel, cobalt), bonded (thermo-elastomer and thermo-plastic resins compounded with a variety of magnetic powders), hard ferrite (ceramic), neodymium-iron-boron (NdFeB), and samarium cobalt ($SmCO_5$ and $SM_2Co_{17}$).

The detection device also has a first distance 118 between the permanent magnetic element 110 and the biasing permanent magnetic element 116. A threshold magnetic field strength is determined from the first magnetic field strength, the second magnetic field strength, the first distance 118, and the location of the 108. Thus, the strength (including the effect of polarity orientation) of the two permanent magnets 110, 116, the distance between them, and the location of 108 dictate how large a magnetic field is required to move indicator 114 toward into the region marked by 108 that indicates that the threshold has been reached. An implanted device can react to magnetic fields of approximately 5 gauss. In an embodiment, detection device 100 can be calibrated to detect magnetic fields of around 80 gauss as the threshold. However, the threshold magnetic field strength can be set lower to allow for a margin of error. The detection device can be preferably set to detect the magnetic field strengths of objects when those strengths are lower than the magnetic field strength that affects the implanted device. Thus, the threshold magnetic field strength can be set anywhere in the range of about 5 gauss to about 120 gauss or greater, depending on the implanted device. Minimum gauss ranges can include about 1, about 5, about 10, about 15, about 20, about 25, about 35, about 40, about 45, about 50, about 55, about 60, about 65, about 70, about 75 gauss and about 80 gauss. Maximum gauss ranges can span about 85, about 90, about 95, about 100, about 105, about 110, about 115, and about 120 or higher.

To use detection device 100, an object 10 is placed on or near to detection end 108. If the magnetic field strength of object 10 is less than that of the threshold magnetic field strength, permanent magnetic element 110 is not drawn to the object magnetic field to a degree significant enough for the indicator to indicator that the threshold has been met or exceeded, instead the indicator 114 remains biased toward first end 106. This indicates to the patient that the object magnetic field strength of object 10 is of lesser strength than the magnetic field strength required to alter the operation of his implanted medical device and it is safe for the patient to approach and use object 10.

However, if the object magnetic field strength is greater than the threshold magnetic field strength, permanent magnetic element 110 is affected by the magnetic field of the object such that the indicator 114 pivots within the detection end marking 108. This indicates to the patient that object 10 emits a magnetic field strong enough to alter operation of his implanted medical device and it is not safe for the patient to approach and use object 10, e.g., a danger condition.

For both examples, a second distance 120 between permanent magnetic element 110 and the detection end 108 or object 10, is also a component of the calculation of the magnetic field strength of the object. Since magnetic field strength is a function of the strength of the magnets and the distance to the point the magnetic field acts upon, there are a number of variables that can be altered to calibrate the detection device and to select the threshold magnetic field strength. The factors to consider for calibrating the detection device are:

A. As the First Magnetic Field Strength increases—the threshold magnetic field strength decreases. (Biasing permanent magnetic element 116 has less effect)

B. As the Second Magnetic Field Strength increases—the threshold magnetic field strength increases. (Biasing permanent magnetic element 116 has more effect)

C. Increase First Distance 118—the threshold magnetic field strength decreases. (Biasing permanent magnetic element 116 has less effect)

D. Increase Second Distance 120—the threshold magnetic field strength increases (Object magnetic field strength has less effect)

Typically, permanent magnetic element 110 and biasing permanent magnetic element 116 have a known and fixed field strength given the size of magnets 110, 116 and the material used. Housing 102 of the detection device typically has a fixed size for comfort and ease of use for the patient, and this fixes second distance 120. Thus, in one embodiment, the calibration of the detection device is performed by altering first distance 118 between the permanent magnetic element 110 and the biasing permanent magnetic element 116. In an alternate embodiment, a marker 108a indicating the detection end 108 can be moved and the artwork for each detection device 100 is altered in lieu calibrating the magnets 110, 116. Another embodiment can take into account the typical implanted depth of the medical device and fix the second distance 120 to that depth. The detection device can have the first end 106 and detection end 108 located at approximately right angles to each other on housing 102.

Another embodiment, illustrated in FIG. 2, can permit detection device 100 to determine the threshold magnetic field strength for multiple medical devices. A multiple detection device 200 can include an intermediate marker 122 on housing 102 located between first end 106 and detection end 108. Multiple detection device 200 can further have a second threshold magnetic field less than the threshold magnetic field. When a second object is placed proximate to the detection end and the second object magnetic field strength is greater than the second threshold magnetic field strength, but less than the threshold magnetic field strength, indicator 114 rotates toward intermediate marker 122. In a further embodiment, a marking 108a for detection end 108 and intermediate marker 122 can consist of a numerical scale ranging from some minimum gauss that causes the permanent magnetic element 110 to rotate 1 or 2 degrees up to the threshold value.

FIG. 4 illustrates a binary type detection device 300. Binary type detection device 300 is designed to return to the patient only a "yes" or "no" answer regarding the object magnetic field strength. A permanent magnetic element 310 can be disposed in or formed as a disk shaped element. Indicator 314 can be alternating colored quadrants of the disk. One color can denote a safe object magnetic field 314a and another denote a dangerous magnetic field 314b (e.g. white and black and green and red). Another embodiment can use symbols or text to indicate a safe or dangerous magnetic filed. A display aperture 324 can only display a portion of indicator 114 and a color change in the aperture 324 indicates the relative object magnetic field strength.

Further to the above calibration parameters, the location of indicator 114 on the disk or the aperture 324, indicating when the threshold is exceeded can also be a variable. The angle at which permanent magnetic element 310 turns so that indicator 114 indicates the threshold has been reached by virtue of its position relative to the display aperture 324.

Additionally, for the analog type embodiments above, the location of the detection end 108 can be modified to suit the device, such that after the calibration parameters are chosen, the significance of the degree to which permanent magnetic element 110 rotates is indicated by markings 108a located near the detection end 108.

FIG. 5 illustrates a flow chart of a method for detecting a strength of a magnetic field of an object. The method includes the steps of disposing the biasing permanent magnetic element 116 in the housing 102 (step 400) and suspending a permanent magnetic element 110 in housing 102 so as to rotate freely (step 402). The permanent magnetic element 110 is biased toward the biasing permanent magnetic element 116 (step 404) and the threshold magnetic field strength is determined (step 406). The housing 102 is placed in proximity to the object 10 (step 408) and the deflection of the suspended permanent magnetic element 110 toward the object is determined (step 410). The deflection of the permanent magnetic element 110 determines if the patient is in danger, as described above, from the object magnetic field.

In another embodiment, a method of determining the threshold magnetic field strength step includes determining a first magnetic filed strength of the permanent magnetic element 110 (step 412) and determining a second magnetic filed strength of the biasing permanent magnetic element 116 (step 414). Further, the first distance 118 between the biasing permanent magnetic element 116 and the permanent magnetic element 110 is determined (step 416) and the second distance 120 is determined between the permanent magnetic element 110 and the detection end 108 (step 418). As described above, the combination of the above elements calibrate the device 100 and determine the threshold magnetic filed strength that the device will detect.

While there have been shown, described, and pointed out fundamental novel features of the invention as applied to preferred embodiments thereof, it will be understood that various omissions, substitutions, and changes in the form and details of the devices illustrated, and in their operation, may be made by those skilled in the art without departing from the spirit and scope of the invention. For example, it is expressly intended that all combinations of those elements and/or steps which perform substantially the same function, in substantially the same way, to achieve the same results are within the scope of the invention. Substitutions of elements from one described embodiment to another are also fully intended and contemplated. It is also to be understood that the drawings are not necessarily drawn to scale, but that they are merely conceptual in nature.

What is claimed is:

1. A detection device for detecting a strength of a magnetic field of an object, comprising:
   a housing having a center, a first end and a detection end;
   a permanent magnetic element suspended above the center of the housing so as to rotate freely about the center, said permanent magnetic element having:
      a first magnetic field strength; and
      an indicator;
   a biasing permanent magnetic element disposed at the first end of the housing and having a second magnetic field strength for biasing the indicator toward the first end;
   a first distance between the permanent magnetic element and the biasing permanent magnetic element; and
   a threshold magnetic field strength being determined from the first magnetic field strength, the second magnetic field strength and the first distance, said threshold magnetic field strength is greater than or equal to 10 gauss;
   wherein when the object is placed approximate to the detection end and the object magnetic field strength is greater than the threshold magnetic field strength, the indicator rotates toward the detection end.

2. The detection device of claim 1, wherein the first end and the detection end are located at approximately right angles to each other on the housing.

3. The detection device of claim 1, wherein the second magnetic field strength is equal to or less than the threshold magnetic field strength.

4. The detection device of claim 1, wherein the first distance is fixed.

5. The detection device of claim 1, further comprising a second distance between the permanent magnetic element and the detection end, said second distance being approximately equal to the first distance.

6. The detection device of claim 5, wherein the second distance is approximately equal to a depth a medical device is implanted in a patient.

7. The detection device of claim 1, further comprising:
   an intermediate marker on the housing disposed between the first end and the detection end; and
   a second threshold magnetic field strength determined from the first magnetic field strength, the second magnetic field strength and the first distance, said second threshold magnetic field strength being less than the threshold magnetic field strength;
   wherein when a second object is placed proximate to the detection end and the second object magnetic field strength is greater than the second threshold magnetic field strength, the indicator rotates toward the intermediate marker.

8. A detection device for detecting a strength of a magnetic field of an object, comprising:
   a housing having a center, a first end, a detection end and a display aperture;
   a permanent magnetic element suspended above the center of the housing so as to rotate freely about the center, said permanent magnetic element having:
      a first magnetic field strength; and
      an indicator;
   a biasing permanent magnetic element disposed at the first end of the housing and having a second magnetic field strength for biasing the indicator toward the first end;
   a first distance between the permanent magnetic element and the biasing permanent magnetic element; and
   a threshold magnetic field strength being determined from the first magnetic field strength, the second magnetic field strength and the first distance, said threshold magnetic field strength is greater than or equal to 10 gauss;
   wherein when the object is placed approximate to the detection end and the object magnetic field strength is greater than the threshold magnetic field strength, the indicator rotates toward the detection end and the indicator is displayed in the display aperture.

9. A method for detecting a strength of a magnetic field of an object, comprising the steps of:
   disposing a biasing permanent magnetic element in a housing;
   suspending a permanent magnetic element in the housing so as to rotate freely;
   biasing the permanent magnetic element toward the biasing permanent magnetic element;
   determining a threshold magnetic field strength;
   placing the housing in proximity to the object; and
   determining the deflection of the suspended permanent magnetic element toward the object.

10. The method of claim 9, wherein the determining a threshold magnetic field strength step comprises the steps of:
   determining a first magnetic filed strength of the permanent magnetic element;
   determining a second magnetic filed strength of the biasing permanent magnetic element;
   determining a first distance between the biasing permanent magnetic element and the permanent magnetic element; and
   determining a second distance between the permanent magnetic element and a detection end of the housing.

* * * * *